United States Patent [19]

Ziuchkovski

[11] Patent Number: 4,893,319

[45] Date of Patent: Jan. 9, 1990

[54] CLOCK REGENERATION CIRCUIT EMPLOYING DIGITAL PHASE LOCKED LOOP

[75] Inventor: Michael J. Ziuchkovski, Portland, Oreg.

[73] Assignee: Planar Systems, Inc., Beaverton, Oreg.

[21] Appl. No.: 286,288

[22] Filed: Dec. 19, 1988

[51] Int. Cl.⁴ .............................................. H04L 7/04
[52] U.S. Cl. .................................. 375/111; 375/119; 375/120; 358/148
[58] Field of Search ............... 375/106, 111, 119, 120, 375/118; 358/148, 158, 153

[56] References Cited

U.S. PATENT DOCUMENTS 4,713,691  12/1987  Tanaka et al. ...................... 358/158

Primary Examiner—Benedict V. Safourek
Assistant Examiner—Marianne Huseman
Attorney, Agent, or Firm—Chernoff, Vilhauer, McClung & Stenzel

[57] ABSTRACT

A clock regeneration circuit employing a digital phase locked loop for locking a video data signal to both a synchronization signal and a clock signal includes an oscillator for producing multiple phase clock signals, a synchronization latch circuit and a data latch circuit for selecting desired ones of the multiple phase clock signals, and a phase comparator for comparing the outputs of each of the latch circuits to produce an error signal which adjusts the phase of the synchronization signal to bring it into coincidence with the video data signal input. The phase adjusted synchronization signal controls the latching in the synchronization latch circuit and selects the appropriate phase of the multiple phase clock signals. In this way the horizontal synchronization pulses are locked to the video data and the locked horizontal synchronization pulses select a properly phased clock signal. In a matrix-addressed visual display, this ensures that the appropriate pixels are illuminated at the proper time.

8 Claims, 2 Drawing Sheets

CLOCK REGENERATION CIRCUIT EMPLOYING DIGITAL PHASE LOCKED LOOP

BACKGROUND OF THE INVENTION

The following invention relates to a clock regeneration circuit employing a digital phase locked loop for phase locking a clock to both a data signal and a second signal which may be a synchronization signal.

In a thin film electroluminescent (TFEL) display, light is emitted at pixel points in a predetermined scanning sequence. In order to generate light at these pixel points at the appropriate time, video data must be synchronized with both an internal clock and horizontal and vertical synchronization. One need with such displays is to create clock pulses that are synchronized to both the edges of the horizontal sync and data pulses from the video input source. The clock's primary purpose is to ensure that the video data is placed in the correct pixel location. Lack of phase synchronization between the data and the internal clock causes noise in the display because the appropriate pixel is not turned on at the right time.

Conventionally, phase locked loops have been used to synchronize internal clock generation to horizontal or vertical synchronization pulses. However, this technique did not include phase locking the data pulses to the internal clock. Also, conventional analog-type phase locked loops can be noisy and often require specialized parts. Most phase locked loops for conventional systems must be finely adjusted to correct for variations that can occur in production. Analog phase locked loops are also sensitive to temperature changes which can be problematical in viewing devices such as TFEL panels which require large voltages and generate heat. Further, to achieve an accuracy level as low as one-fourth pixel, a high loop gain, which would tend to make the phase locked loop unstable, would be required.

SUMMARY OF THE INVENTION

The present invention provides a clock regeneration network for phase locking an internal clock to both incoming video data pulses and horizontal or vertical synchronization pulses. Phase locking is achieved at a noise margin which is a 60 db improvement over standard analog phase locked loop circuits.

According to the invention, an oscillator generates a fundamental clock signal which is phase shifted to provide multiple phase clock signals. Selected ones of these phase shifted clock signals are latched in two latching circuits, one of which is responsive to the incoming data pulses, and the other of which responds to a phase corrected version of the horizontal synchronization pulse. The respective latched versions of the multiple phase clock signals are compared in a comparator circuit which generates an error signal that in turn adjusts the phase of the synchronization pulses. This closes the loop so that the horizontal sync pulses and the clock become phase locked. The output of the horizontal synchronization latch then selects the appropriate one of the multiple phase clock signals. Since the phase adjustment looks for variations in phase between the data and the horizontal synchronization pulses, the result of shifting the phase of the horizontal sync pulses results in ensuring time coincidence between those pulses and the data pulses. The result is that the clock, synchronization and data pulses are all phase locked together.

It is a principal object of this invention to provide a clock regeneration network for phase locking an internal clock, a stream of data pulses, and an auxiliary pulse such as a synchronization pulse.

A further object of this invention is to achieve accurate time coincidence between horizontal synchronization, clock, and data pulses with a high degree of stability and low noise generation.

A still further object of this invention is to provide a low cost digital phase locked loop network for video data, horizontal synchronization, and internal clock pulses.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
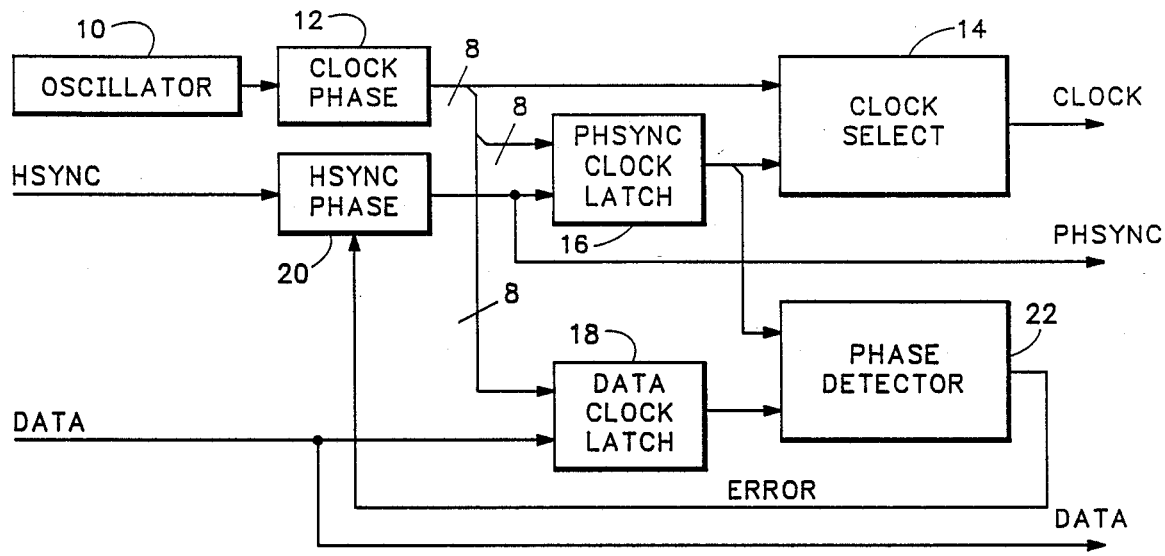
FIG. 1 is a block schematic diagram of a digital clock regeneration circuit employing a digital phase locked loop.
Figure 4:
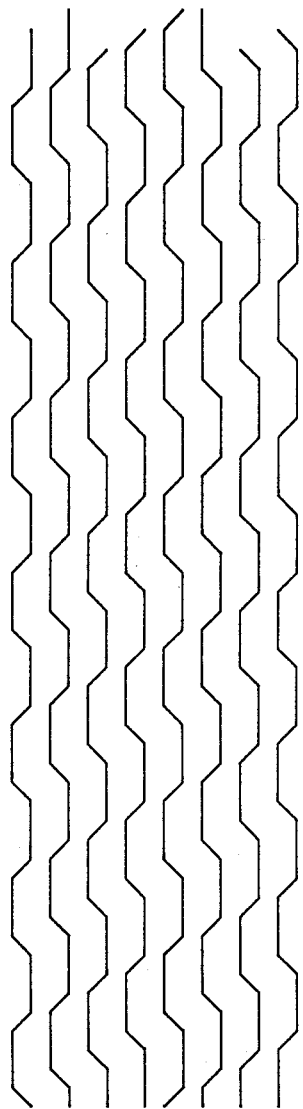
FIG. 4 is a wave form diagram illustrating correspondence between the multiple phase clock outputs and the latched code of FIG. 1.

Referring to FIG. 1 an oscillator 10 generates a fundamental clock signal which forms the input to a clock phase generator 12 that generates multiple phase clock signals, each one delayed one-eighth of a full clock period. (The outputs of the clock phase generator 12 are shown in FIG. 4.) The clock phase generator 12 may be implemented through the use of a digital delay line having four different taps with delay increments between the taps of one-eighth T where T is the period of the fundamental clock pulses from oscillator 10.

The outputs of the clock phase generator 12 are connected to a clock select circuit 14, a phased horizontal synchronization (PHSYNC) clock latch circuit 16 and a data clock latch circuit 18. The other input to the data clock latch circuit 18 is the incoming video data signal. An auxiliary signal which may, for example, be horizontal synchronization, is connected to a horizontal sync (HSYNC) phase adjustment circuit 20 which may be a digital delay line with electronically selectable output taps. The output of the phase adjustment circuit 20 forms the other input to synchronization clock latch circuit 16. The respective outputs of latch circuits 16 and 18 form the inputs to a phase detector 22 whose output constitutes an error signal controlling the phase adjustment of HSYNC phase adjusting circuit 20.

Figure 2:
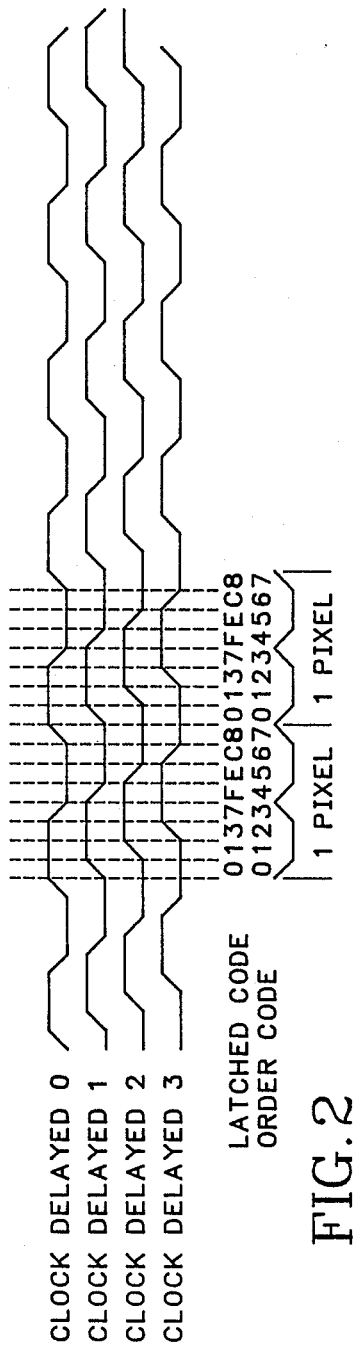
FIG. 2 is a wave form diagram illustrating multiple phase clock signals and a latching code which divides the clock signals into equal phase intervals.

One of the multiple phase clock signals from the output of the clock phase generator 12 is latched in each of the respective latch circuits 16 and 18 by a selected edge of the signal output of the HSYNC phase shifter 20 (in the case of PHSYNC clock latch 16) and by the video data (in the case of the data clock latch circuit 18). In each case the selected clock signal generates a code which is a function of the amount of phase delay with respect to the fundamental clock signal from oscillator 10. The latch code is shown in FIG. 2 and corresponds to an order code that divides the clock signal into eight equal increments. The codes from the two latch circuits 16 and 18 are compared in the phase detector 22. The resulting error signal increments the HSYNC phase shift circuit 20 according to the following table, Table 1, which shows the relationships between the horizontal sync clock phase code and the possibilities for the corresponding data clock phase codes compared in the phase detector 22.

TABLE 1

| Data and HSYNC Clock Phasing | | |
|---|---|---|
| HSYNC Clock Phase | Data Clock Phase | Change PHSYNC Select |
| 0 | 8, 0, 1 | 0 |
| 1 | 0, 1, 3 | 0 |
| 3 | 1, 3, 7 | 0 |
| 7 | 3, 7, F | 0 |
| F | 7, F, E | 0 |
| E | F, E, C | 0 |
| C | E, C, 8 | 0 |
| 8 | C, 8, 0 | 0 |
| 0 | 3, 7, F | −1 |
| 1 | 7, F, E | −1 |
| 3 | F, E, C | −1 |
| 7 | E, C, 8 | −1 |
| F | C, 8, 0 | −1 |
| E | 8, 0, 1 | −1 |
| C | 0, 1, 3 | −1 |
| 8 | 1, 3, 7 | −1 |
| 0 | E, C | +1 |
| 1 | C, 8 | +1 |
| 3 | 8, 0 | +1 |
| 7 | 0, 1 | +1 |
| F | 1, 3 | +1 |
| E | 3, 7 | +1 |
| C | 7, F | +1 |
| 8 | F, E | +1 |

As Table 1 shows, the error signal depends upon whether the clock pulse selected in the PHSYN clock latch leads, lags or is time coincident with the clock pulse selected in the data clock latch 18. The effect of the closed loop from the phase detector 22 to the HSYNC phase control circuit 20 will be to bring the two selected clock pulses in circuits 16 and 18, respectively, into phase alignment. At the same time, the output of the synchronization clock latch circuit 16, which is the coded signal shown in Table 1, will select the particular one of the multiple phase clock pulses that corresponds to that particular code in the clock select circuit 14.

Figure 3:
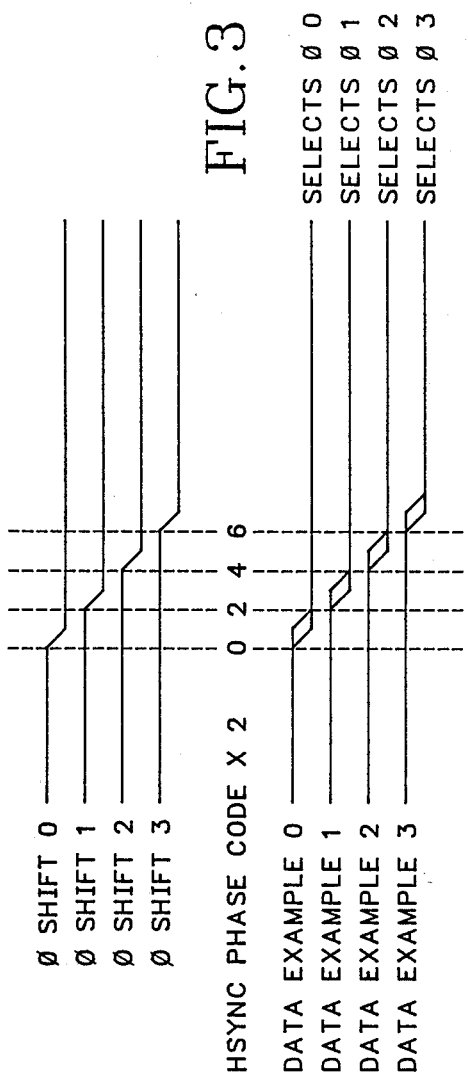
FIG. 3 is a wave form diagram illustrating how the phase of the horizontal sync pulses is shifted depending upon the position of the data pulses.

As FIG. 3 shows, the phase locking is accurate to one-fourth of a period of the primary clock signal. For example, the data pulse can vary between position 0 and position 2 (order code) in order to properly select the delayed clock pulse signal that corresponds to horizontal synchronization pulse having an order code of 0. Similarly between positions 2 and 4 a clock signal corresponding to the synchronization pulse in order code position 1 will be selected. When the data pulse falls between order code positions 4 and 6 the position 2 sync pulse will be selected and when it falls between positions 6 and 0 the position 3 sync pulse will be selected. This maintains accuracy of the system to one-fourth of the period of a clock pulse which translates to one-fourth of the time used to illuminate each pixel.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A clock regeneration network for phase locking a data signal to an auxiliary signal and to a clock signal comprising:
   (a) clock oscillator means for producing multiple phase regenerated clock signals whose respective phases vary from the phase of a primary clock signal by a predetermined phase amount;
   (b) a clock latch means connected to said clock oscillator means and responsive to a data signal for selecting the one of said multiple phase regenerated clock signals that is in phase with said data signal;
   (c) an auxiliary signal phase shift network for shifting the phase of an auxiliary signal in response to an error signal;
   (d) clock signal selection means for selecting the one of the multiple phase regenerated clock signals that is in phase with the output of the auxiliary signal phase shift network; and
   (e) phase detector means for comparing the phase of the output of the clock signal selection means with the phase of the output of the clock latch means and for generating said error signal.

2. The clock regeneration network of claim 1 wherein said clock oscillator means comprises an oscillator and a digital delay line having multiple output taps, one for each of said multiple phase regenerated clock signals.

3. The network of claim 1 wherein said clock selection means includes latching means for latching the one of said multiple phase regenerated clock signals that is in phase with the output of said phase shift network to produce a selection signal, and digital selection means responsive to said selection signal for choosing said one of said multiple phase regenerated clock signals as a clock output.

4. The network of claim 1 wherein said clock latch means includes first encoder means for generating a first phase code indicating the phase of a first selected one of said multiple phase regenerated clock signals, and wherein said clock signal selection means includes second encoder means for generating a second phase code indicating the phase of a second one of said multiple phase clock signals, and wherein said phase regenerated detector means includes means for comparing said first and second phase codes and for generating said error signal comprising a digital signal indicating whether said first selected one of said clock signals leads, lags or is time coincident with said second selected one of said clock signals.

5. The network of claim 1 wherein said auxiliary signal is a horizontal synchronization signal.

6. A clock regeneration network for phase locking a data signal to both a synchronization signal and a clock signal comprising oscillator means for producing multiple phase regenerated clock signals, a synchronization latch circuit and a data latch circuit for selecting desired ones of said multiple phase clock signals, a phase regenerated comparator for comparing the respective outputs of said latch circuits and for producing an error signal to adjust the phase of said synchronization signal to bring it into coincidence with the data signal input and to select one of said clock signals as a clock pulse whereby said clock pulse is in phase with both said data signal and said synchronization signal.

7. The clock regeneration network of claim 6 wherein said synchronization latch circuit is responsive to the output of a synchronization phase shift circuit to select the one of said multiple phase regenerated clock signals that is in phase with said output.

8. The clock regeneration network of claim 7 wherein said synchronization phase shift circuit is responsive to said error signal.

* * * * *